(12) United States Patent
Godschalx et al.

(10) Patent No.: US 6,359,091 B1
(45) Date of Patent: Mar. 19, 2002

(54) POLYARYLENE COMPOSITIONS WITH ENHANCED MODULUS PROFILES

(75) Inventors: James P. Godschalx, Midland; Kenneth J. Bruza, Alma; Qing Shan J. Niu, Midland; Clark H. Cummins, Midland; Paul H. Townsend, III, Midland, all of MI (US)

(73) Assignee: The Dow Chemical Company, Midland, MI (US)

( * ) Notice: Subject to any disclaimer, the term of this patent is extended or adjusted under 35 U.S.C. 154(b) by 0 days.

(21) Appl. No.: 09/447,012

(22) Filed: Nov. 22, 1999

(51) Int. Cl.$^7$ ............................................. C08F 38/00
(52) U.S. Cl. ......................... 526/285; 526/281; 568/17
(58) Field of Search ............................... 526/281, 285; 568/17

(56) References Cited

U.S. PATENT DOCUMENTS

| | | | |
|---|---|---|---|
| 3,282,864 A | 11/1966 | Bost et al. | 260/2.5 |
| 5,155,175 A | 10/1992 | Mercer et al. | 525/390 |
| 5,235,044 A | 8/1993 | Mercer et al. | 534/551 |
| 5,965,679 A | * 10/1999 | Godschalx et al. | 526/281 |

FOREIGN PATENT DOCUMENTS

| | | |
|---|---|---|
| WO | WO 91/09081 | 6/1991 |
| WO | WO 97/10193 | 3/1997 |

OTHER PUBLICATIONS

*Macromolecules*; vol. 28; "Diels–Alder Polymerization between Bis(cyclopentadienones) and Acetylenes. A Versatile Route to New Highly Aromatic Polymers;" Kumar & Neenan; pp. 124–130; 1995.
*J. Polym. Science*; Part B; Polymer Letters; vol. 7; "Preparation of Poly(Octaphenyl–Tetraphenlene);" Wrasidio & Augl; pp. 519–523; 1969.
*Macromolecules*; "New Thermal Cross–Linkers Based on Triazene: Cross–Linking of Fluorinated Polyimides and Aromatic Polymers;" Lau & Vo; pp. 7294–7299; 1992; 25.
*Polymer Preprints* (ACS); "3,3–Dimethyl–1–phenylenetriazene End–Capped Oligomers of Fluorinated Aryl Ether;" Lau & Vo; pp. 996–997; 1992; 33.
*Polym. Mater. Science Eng.*; "Novel Crosslinking Reagents Based on 3,3–Dimethyl–1–phenylenetriazene;" Lau & Vo; pp. 241–242; 1992.
*J. Polym. Sci.*; Part A: Polym. Chem.; vol. 31; "Thermal Crosslinking of Polyimides and Polysulfone Using 3,3–Dimethyl–1–phenyltriazene Compounds;" Lau, et al.; pp. 1093–1096; 1993.
*J. Polym. Sci.*; Part A: Polym. Chem.; vol. 32; Self–Crosslinkable Poly(arylene ether)s Containing Pendent Phenylenetriazene Groups; Lau, et al.; pp. 1507–1521; 1994.
*Polym. Mater. Sci. Eng.*; "Self–Crosslinkable Poly(arylene ether)s Based on Phenylenetriazene Pendants;" Lau & Vo; pp. 242–243; 1993.
Rusanov et al. "Phenylated Polyphenylenes Containing Hexafluoroisopropylidene Groups," *Polymer Preprints*, 59, (2), pp. 794–795, 1998.

* cited by examiner

*Primary Examiner*—David W. Wu
*Assistant Examiner*—William Cheung

(57) ABSTRACT

This invention is a polyarylene composition in which resin does not undergo a significant drop in modulus at temperatures above 300° C. during cure. This feature enables one to form porous films by avoiding pore collapse and/or using a wider variety of poragen materials.

7 Claims, 3 Drawing Sheets

POLYARYLENE COMPOSITIONS WITH ENHANCED MODULUS PROFILES

This invention was made with United States Government support under Cooperative Agreement No. 70NANB8H4013 awarded by NIST. The United States Government has certain rights in the invention.

FIELD OF THE INVENTION

This invention relates to compositions useful in making low dielectric constant insulating layers in microelectronic devices.

BACKGROUND OF THE INVENTION

As semiconductor devices become smaller and smaller, and chip packing densities increase correspondingly, undesirable capacitative delays and crosstalk between metal interconnects are more acutely manifested. There has been a movement away from using silicon dioxide with a dielectric constant of about 4.2 to benzocyclobutene based polymers (BCB), such as CYCLOTENE™ resins from The Dow Chemical Company, and polyarylene resins, such as those disclosed in WO98/11149, both of which have dielectric constants of about 2.6. Since capacitative delays and crosstalk relate to the dielectric constant of the insulator, additional attention has focused on the creation of ultra-low dielectric constant materials (that is, dielectric materials having dielectric constants of $\leq 2.0$). Such efforts include creating porous inorganic (for example, silicon dioxide) or thermoplastic polymeric (for example, polyimide) materials.

Silicon dioxide, which has been the dominant interlevel dielectric material (ILD) for the past 40 years, can be made porous by well developed sol-gel techniques such as those disclosed in *Proc. Mat. Res. Soc.* 381, 261 (1995); *Proc. Mat. Res. Soc.* 443, 91 (1997); and *Proc. Mat. Res. Soc.* 443, 99 (1997). The inorganic networks which form are highly cross-linked and exhibit substantial modulus at early stages of their formation utilizing relatively low temperature processes. Although the introduction of pores into silicon dioxide causes a reduction of dielectric constant from 4.2 to less than 2.0, the resultant porous material is significantly weakened and the porous coatings are easily damaged during handling and during the processing steps necessary to fabricate microelectronic devices. Thus, porous silicon dioxide is impractical as an ultra-low dielectric constant material.

Porous thermoplastic polymers, particularly thermally stable polymers such as polyimides, have also been investigated for use as ultra-low dielectric constant materials. Although these porous thermoplastic materials can be made to have acceptable dielectric constants and are relatively tough, being able to withstand the mechanical processing steps necessary to fabricate microelectronic devices, the pores tend to collapse during subsequent high temperature processing due to the modulus drop associated with being above the glass transition temperature of the resin, thereby precluding the use of these materials for the applications of interest.

The initial proposals for developing porous layers generally involve adding a pore generating material, also referred to as a poragen, to a composition comprising a matrix precursor, forming the matrix from the precursor, and then degrading the pore generating material, to form pores in the matrix material.

SUMMARY OF THE INVENTION

Applicants have discovered that despite being thermosetting resins, certain of the polyarylene resin formulations disclosed in WO98/11149 may suffer from pore collapse when attempting to form a porous structure from the resin by introduction of a poragen into the b-staged formulation, curing and removal of that poragen. This is believed to occur because the poragen degrades before the matrix has sufficiently set. Modifying the formulation so that the resin does not undergo a significant drop in modulus during cure or alternatively shifting the temperature at which the minimum modulus occurs to a lower temperature, enables one to avoid pore collapse and/or use a wider variety of poragen materials.

Thus, according to a first embodiment, this invention is a composition comprising a partially polymerized reaction product of a reaction mixture comprising a compound having two or more cyclopentadienone functional groups and a compound having three or more acetylene functional groups, wherein the composition is further characterized by one or more of the following characteristics:

(a) the ratio of cyclopentadienone groups to acetylene groups in the reaction mixture is at least about 3:4 and, preferably no greater than 2:1, more preferably the ratio is in the range of 9:10 to 10:9, and most preferably the ratio is about 1:1;

(b) the compound having three or more acetylene functional groups is selected from the group consisting of tris(phenylethynyl)diphenyl ethers, tris(phenylethynyl)-ortho-terphenyls, 4',4',4'-tris(phenylethynyl)-1,3,5-triphenylbenzene, and 3',3',3'-tris(phenylethynyl)-1,3,5-triphenylbenzene;

(c) the reaction mixture further comprises a compound which has the ability to react with non-functionalized aryl groups;

(d) the composition further comprises a reagent selected from the group consisting of bis-ortho-diacetylenes, mono-ortho-diacetylenes, bistriazenes, tetrazines, bisazides, bissulfonylazides and peroxides. Preferably, the composition comprises a solvent and most preferably also comprises a poragen.

According to an alternative embodiment, the invention is a composition comprising precursor compound(s) which when cured form a polyarylene material wherein the composition has a modulus profile as measured by torsional impregnated cloth analysis (TICA) characterized in that during heating of the composition a minimum measured modulus observed in the temperature range from 250 to 450° C. occurs at a temperature Tmin, and said minimum measured modulus is greater than a value equal to 20 percent of a measured cured modulus of the composition after heating to a maximum temperature and cooling back down to Tmin. According to a third embodiment, the modulus profile is characterized by having a modulus at 388° C. during heating of the composition which is greater than a value equal to 20 percent of a measured cured modulus of the composition at 388° C. after cure. The invention is also a mixture comprising the composition of the second or third embodiments and a solvent, and preferably, a poragen.

Finally, the present invention is a method of making a film comprising coating one of the above compositions onto a substrate, removing the solvent, and curing the resin. Preferably, the composition further comprises a poragen and the method includes a step of removing (e.g. by decomposition) the poragen. The solvent removal, curing, and removing (decomposition) steps may occur separately in stages or may be accomplished by a single heating step. The present invention further includes an article comprising the film made in accordance with the seventh embodiment. Preferably, the article is an integrated circuit article.

DETAILED DESCRIPTION OF THE INVENTION

Figure 1:
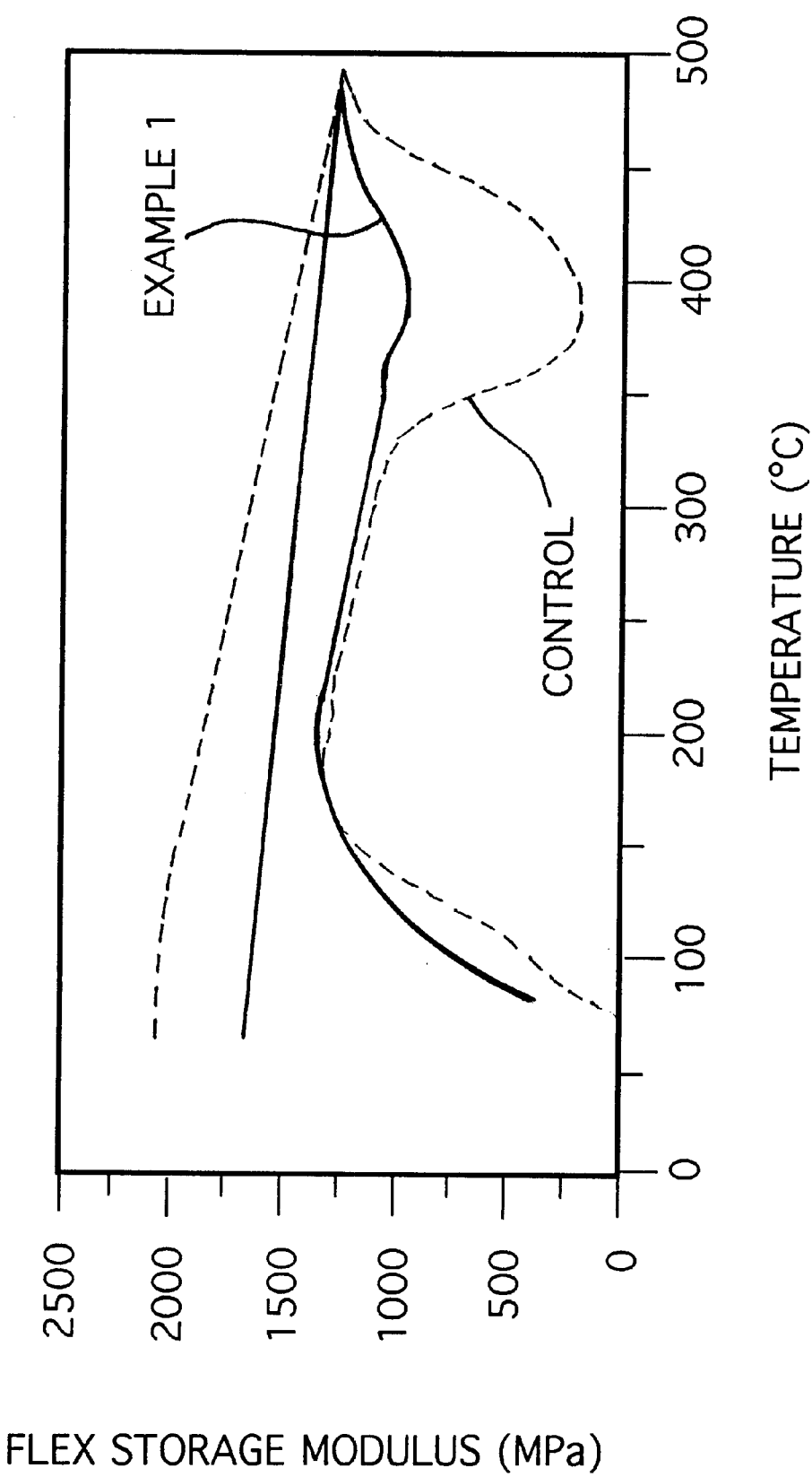
FIGS. 1–3 are TICA plots for various polyarylene formulations.

A modulus profile of the polyarylene materials during cure may be determined by evaluation of the formulation using torsional impregnated cloth analysis (TICA). In this technique a woven glass cloth (preferably, 0.3 mm thick, 15 mm wide, and 35 mm long) is mounted in a dynamic mechanical analyzer, such as a DuPont 983 DMA, preferably fitted with a Low Mass Vertical Clamp Accessory or equivalent functionality to enhance sensitivity. The ends of the cloth are wrapped in aluminum foil leaving 10 mm in length exposed. The cloth is then mounted in the vertical clamps of the dynamic mechanical analyzer which were set 10 mm apart. The clamps are tightened to about 12 inch pounds using a torque wrench. The cloth is impregnated using a solution comprising the precursor compounds at 10 to 30 percent solids via a pipet. The cloth is thoroughly soaked with the solution and any excess is removed using the pipet. A heat deflector and oven are attached and a nitrogen flow of about 3 standard cubic feet per hour is established. Amplitude of the displacement is set to 1.00 mm and frequency is set to 1 Hz. The sample is heated to 500° C. at 5° C. per minute and then allowed to cool. Data is collected during both the heating and cooling stages. Data analysis may be performed to obtain temperature versus flexural modulus values for the composite of glass and formulation. Prepared software programs such as DMA Standard Data Analysis Version 4.2 from DuPont or Universal Analysis for Windows 95/98/NT Version 2.5H from TA Instruments, Inc., may be used to perform the data analysis. The modulus values themselves are not absolute values for the tested formulation due to the contribution of the glass cloth and the unavoidable variation in sample loading. However, ratioing the modulus value at a point during heating to a modulus of the composite after cure and cool down to some consistent temperature gives a value which can be used to compare different formulations. A typical TICA plot for a control formulation is shown, for example, in FIG. 1.

Although not wishing to be bound by theory, the inventors believe it is thought that on heat-up the solvent from the formulation is lost leading to an initial increase in the modulus of the cloth/matrix composite. After further heating the modulus begins to decrease as the temperature of the scan reaches and then exceeds the glass transition temperature of the mixture of precursor compounds. As the precursor compounds begin to react or cure the modulus again increases and then levels out as cure is complete. Upon cool-down the modulus slowly increases in a fairly linear manner. As noted, for the control, a significant drop in modulus is observed between 300 and 400° C. Pore collapse problems can be minimized by raising the modulus in this temperature range. The modulus drop for the formulations of this invention may either be less dramatic or may be moved to a lower temperature, e.g. having the minimum modulus at temperature less than about 325° C. The latter approach helps avoid pore collapse because it is less likely that significant degradation of the poragens will have occurred at these low temperatures.

As used herein "Measured Heat-up Modulus" is the modulus at a given temperature detected for the test composite during the heating phase of the test on a plot of modulus versus temperature.

"Minimum Measured Heat-up Modulus" is the minimum Measured Heat-up Modulus occurring in the temperature range of 250 to 450° C.

"Measured Cured Modulus" is the modulus at a given temperature for the test composite during the cool down phase.

The precursor compounds of this invention cure to a polyarylene. By polyarylene is meant aryl moieties or inertly substituted aryl moieties which are linked together by bonds, fused rings, or inert linking groups such as oxygen, sulfur, sulfone, sulfoxide, carbonyl, etc. The precursor composition may comprise monomers, oligomers, or mixtures of monomers and oligomers. Preferably, the precursor composition comprises cyclopentadienone functional compounds and acetylene functional aromatic compounds, and/or partially polymerized reaction products of such compounds, as disclosed in WO98/11149, incorporated herein by reference. The most preferred precursor compositions comprise the following monomers and/or the partially polymerized reaction products of the following monomers:

(a) a biscyclopentadienone of the formula:

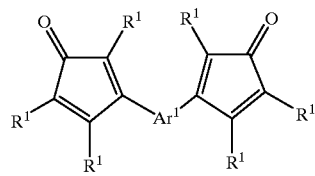

(b) a polyfunctional acetylene of the formula:

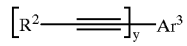

(c) and, optionally, a diacetylene of the formula:

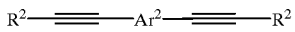

wherein $R^1$ and $R^2$ are independently H or an unsubstituted or inertly-substituted aromatic moiety and $Ar^1$, $Ar^2$ and $Ar^3$ are independently an unsubstituted aromatic moiety, or inertly-substituted aromatic moiety, and y is an integer of three or more. Stated alternatively, the most preferred precursor material comprises a curable polymer of the formula:

wherein A has the structure:

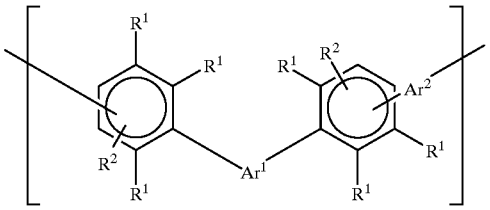

and B has the structure:

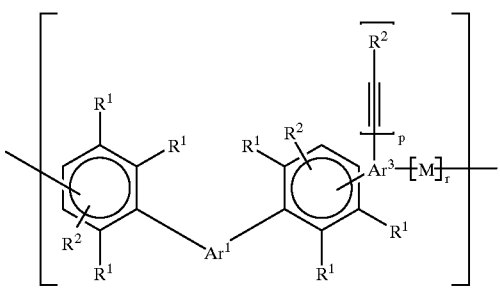

endgroups EG are independently represented by any one of the formulas: EG=

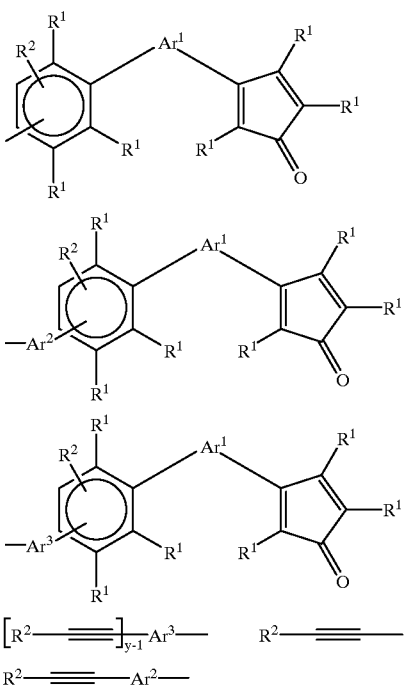

wherein $R^1$ and $R^2$ are independently H or an unsubstituted or inertly-substituted aromatic moiety and $Ar^1$, $Ar^2$ and $Ar^3$ are independently an unsubstituted aromatic moiety or inertly-substituted aromatic moiety and M is a bond, y is an integer of three or more, p is the number of unreacted acetylene groups in the given mer unit, r is one less than the number of reacted acetylene groups in the given mer unit and p+r=y−1, z is an integer from 1 to about 1000; w is an integer from 0 to about 1000 and v is an integer of two or more.

There are a variety of paths which may be used to attain the desired highly branched polyarylene and the polyarylene precursor compositions having the desired modulus profiles during cure. While the preferred polyarylenes are the reaction product of aromatic compounds having two or more cyclopentadienone groups and aromatic compounds having three or more acetylene groups, and this preferred system will be the focus of the discussion, the Inventors contemplate that the same concepts would apply to other aromatic diene and dienophile compounds.

First, a high degree of branching may be introduced at the initial stage of polymerization of the monomers (i.e., the partial polymerizing or b-staging). The precursor composition then comprises monomers which form branched curable oligomers and/or those branched oligomers which can cure to form the matrix. To increase the degree of branching during cure one of the following approaches may be used: a) adjusting the ratio of cyclopentadienone groups to acetylene groups in the mixture to values of greater than about 3:4 and, preferably no greater than about 2:1, more preferably the ratio is in the range of 9:10 to 10:9, and most preferably the ratio is about 1:1, provided that at least some of the compounds have three or more reactive functional groups (e.g. cyclopentadienone or acetylene groups) b) using acetylene functional compounds in which the acetylene groups are highly accessible to react with the cyclopentadienone groups, or c) adding additional reagents that can react with the polyarylene chain and cause further cross-linking or branching.

According to one preferred subset of approach a), the monomers are difunctional aromatic cyclopentadienones (CPD) and tri-functional aromatic acetylenes. In order to have the desired ratio of CPD to acetylene, one adjusts the mole ratio of CPD functional compound to acetylene functional compound. Alternatively, a higher functional (3 or more) CPD monomer may be introduced to attain the desired ratio. Suitable higher functional cyclopentadienones include 1,3,5-tris(3-oxo-2,4,5-triphenylcyclopenta-1,4-dienyl)benzene, 4',4',4'-tris(3-oxo-2,4,5-triphenylcyclopenta-1,4-dienyl)1,3,5-triphenylbenzene, 4',4'4'-tris(3-oxo-2,4,5-triphenylcyclopentadienyl)1,3,5-triphenoxybenzene, and the like.

For approach b), the monomers again are preferably difunctional CPD compounds and tri-functional acetylene compounds. At least some of the acetylene compounds however, have relatively highly accessible acetylene groups. Examples of such accessible acetylene functional compounds include tris(phenylethynyl)diphenyl ethers, tris(phenylethynyl)-ortho-terphenyls, 4',4',4'-tris(phenylethynyl)-1,3,5-triphenylbenzene, 3',3',3'-tris(phenylethynyl)-1,3,5-triphenylbenzene and the like.

For approach c) the basic monomers are again preferably difunctional CPD compounds and tri-functional acetylene compounds. The additional reagents may be characterized by the ability to react with non-functionalized aryl groups by, for example, abstraction of protons forming aryl radicals which can combine with other such radicals or radicals on the additional reagent, insertion into aryl-H bonds forming linkages between two polyarylene chains, etc. Examples of such reagents include bis-ortho-diacetylenes as disclosed for example in WO 97/10193, incorporated herein by reference; mono-ortho-diacetylenes; bistriazenes, as disclosed in U.S. Pat No. 5,155,175, Macromolecules 1992, 25, 7294–7299, incorporated herin by reference; tetrazines, such as 1,3, diphenyltetrazine; bisazides, such as bissulfonylazides as disclosed for example in U.S. Pat. No. 3,282,864, incorporated herin by reference; and peroxides, including diperoxides. The loading levels of the reagents preferably vary from about 1 wt. percent based on solids to about 30 wt. percent based on solids.

Alternatively, branching of the polymer may be increased after the initial b-staging. In this case, the precursor composition comprises a polyarylene oligomer and reagents which can lead to branching of the polyarylene oligomer and reagents. The polyarylene oligomer is preferably the reaction product of a difunctional cyclopentadienone compound and a trifunctional acetylene compound. The reagents may be bis-ortho-diacetylenes as disclosed for example in WO97/10193, incorporated herein by reference, monoortho-diacetylenes, bistriazenes, tetrazines, bisazides, bissulfonylazides and peroxides.

The solvent may be any known solvent useful in processing thermoset polyarylene precursor compositions. The solvent may be a single solvent or a mixture of one or more solvents. Suitable solvents include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

The poragen which is preferably also present in the composition may be any compound that can form small domains in a matrix formed from the precursors and cab be subsequently removed, e.g. by thermal decomposition. Examples of suitable poragens may be found in U.S. Provisional Application No. 60/109110 and in U.S. application Ser. No. 09/447,011, pending, filed concurrently with this application, both of which are incorporated herein by reference. The poragen may be a block polymer, wherein one of the blocks is compatible with cross-linked polymer matrix resin and the other block is incompatible therewith. Useful polymer blocks can include polystyrenes such as polystyrene and poly-α-methylstyrene, polyacrylonitriles, polyethylene oxides, polypropylene oxides, polyethylenes, polylactic acids, polysiloxanes, polycaprolactones, polyurethanes, polymethacrylates, polyacrylates, polybutadienes, polyisoprenes, polyvinyl chlorides, and polyacetals, and amine-capped alkylene oxides (commercially available as Jeffamine™ polyether amines from Huntsman Corp.). Thermoplastic homopolymers and random (as opposed to block) copolymers may be utilized as poragens. As used herein, "homopolymer" means compounds comprising repeating units from a single monomer. Suitable thermoplastic materials include polystyrenes, polyacrylates, polymethacrylates, polybutadienes, polyisoprenes, polyphenylene oxides, polypropylene oxides, polyethylene oxides, poly (dimethylsiloxanes), polytetrahydrofurans, polyethylenes, polycyclohexylethylenes, polyethyloxazolines, polyvinylpyridines, polycaprolactones, polylactic acids, copolymers of these materials and mixtures of these materials. The thermoplastic materials may be linear, branched, hyperbranched, dendritic, or star like in nature. The poragen may also be designed to react with the cross-linkable matrix precursor during or subsequent to b-staging to form blocks or pendant substitution of the polymer chain. For example, thermoplastic polymers containing reactive groups such as vinyl, acrylate, methacrylate, allyl, vinyl ether, maleimido, styryl, acetylene, nitrile, furan, cyclopentadienone, perfluoroethylene, BCB, pyrone, propiolate, or ortho-diacetylene groups can form chemical bonds with the cross-linkable matrix precursor, and then the thermoplastic can be removed to leave pores. The poragen may also be a material that has an average diameter of about 1 to about 50 nm. Examples of such materials include dendrimers (available through Dendritech, Inc., and described by Tomalia et al., *Polymer J.* (Tokyo), vol. 17, 117 (1985), which teachings are incorporated herein by reference); hyperbranched polymer systems, and latex particles. These materials may be non-reactive with the cross-linkable matrix precursor, or reactive as described above.

These compositions may be used to make dielectric films and interlayer dielectrics for integrated circuits in accordance with known processes. See e.g. WO98/11149, incorporated herein by reference. To make a porous film the poragen is preferably removed by thermal decomposition of the poragen.

The following examples are for illustrative purposes only and are not intended to limit the scope of this invention.

EXAMPLE 1

Addition of Cross-linker to Polyarylene Oligomer Solution

To a 1 g sample of the oligomer solution from 4,4'-bis(2,4,5-triphenylcyclopentadien-3-one)diphenyl ether and 1,3,5-tris(phenylethynyl)benzene mole ratio 1:1 (20 percent solids in gamma-butyrolactone/cyclohexanone) was added 11.5 mg of 1,2,4,5-tetra(phenylethynyl)benzene. The mixture was warmed until homogeneous. The mixture was tested according to the TICA method described above, except that the thickness of the braid was 0.1 mm. The flexural modulus of the glass braid/resin composite was then plotted versus temperature. Data from the analysis of the oligomer solution from 4,4,'-bis(2,4,5-triphenylcyclopentadien-3-one)diphenyl ether and 1,3,5-tris(phenylethynyl)benzene mole ratio 1:1 without any additive (Control) was obtained similarly for comparison. A comparison plot of the two sets of data is shown in FIG. 1.

The oligomer solution from 4,4'-bis(2,4,5-triphenylcyclopentadien-3-one)diphenyl ether and 1,3,5-tris(phenylethynyl)benzene mole ratio 1:1 material with the added cross-linker shows substantially less drop in modulus in the 350 to 450° C. temperature range than the non-modified material. The ratio of modulus at the minimum of the curve to the modulus at about 380° C. after cure for the two samples are 0.58 and 0.14.

EXAMPLE 2

Addition of Cross-linker to Polyarylene Oligomer Solution

Figure 2:
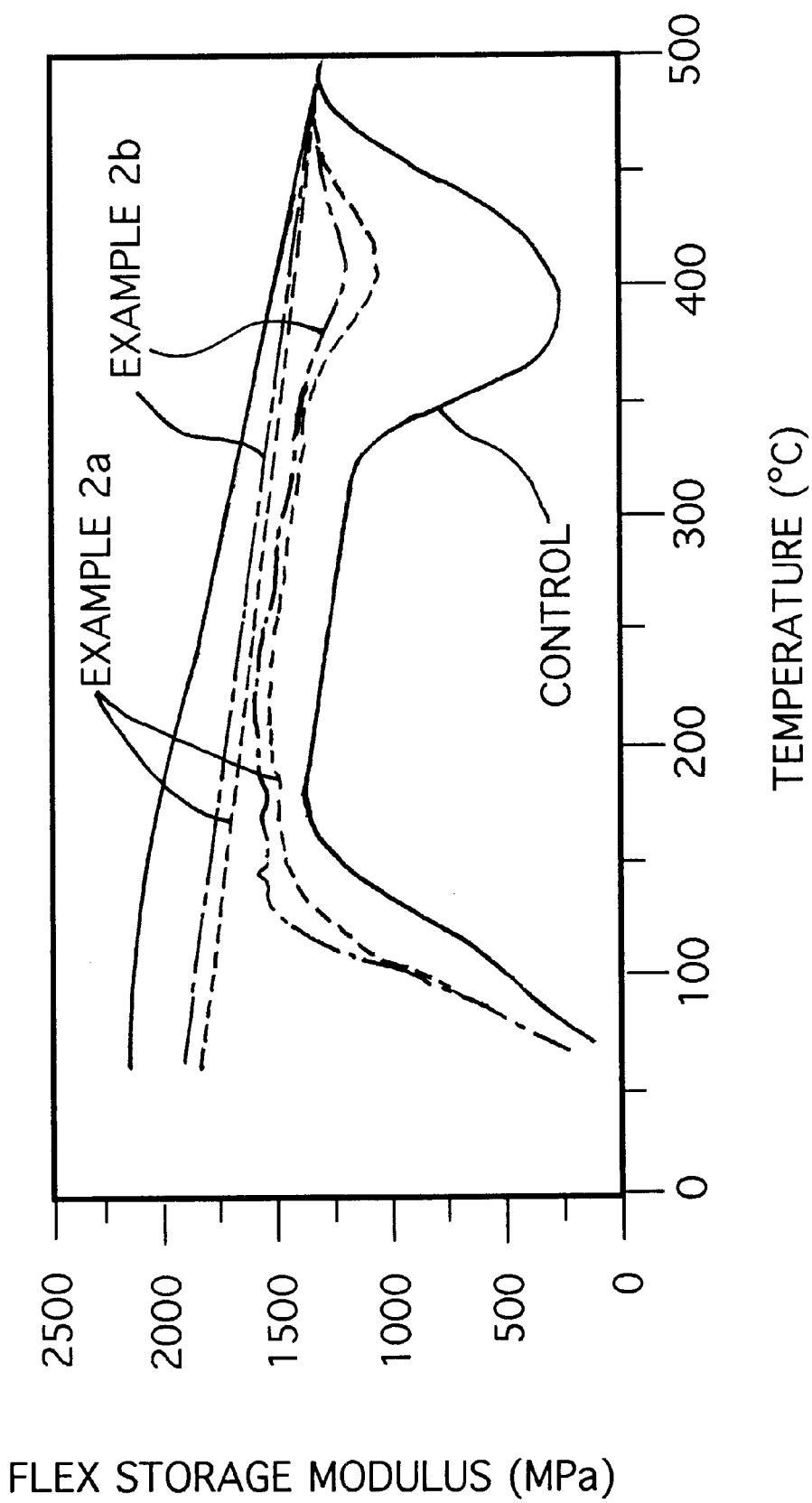

To a 1 g sample of the oligomer solution from 4,4'-bis(2,4,5-triphenylcyclopentadien-3-one)diphenyl ether and 1,3,5-tris(phenylethynyl)benzene mole ratio 1:1 (20 percent solids in gamma-butyrolactone/cyclohexanone) was added 4,4'-oxy-bis-benzenesulfonyl azide (DPO-BSA). The formulation was tested according to the TICA method previously described except for the fact that the thickness of the braid was 0.1 mm. Data at 0 mg (Control), 8 mg (Example 2a), and 17 mg (Example 2b) of DPO-BSA are shown in FIG. 2.

The ratio of modulus at the minimum of the curve to the modulus at about 380 to 400° C. after cure for the three samples are 0.14, 0.61, and 0.80 respectively.

EXAMPLE 3

Figure 3:
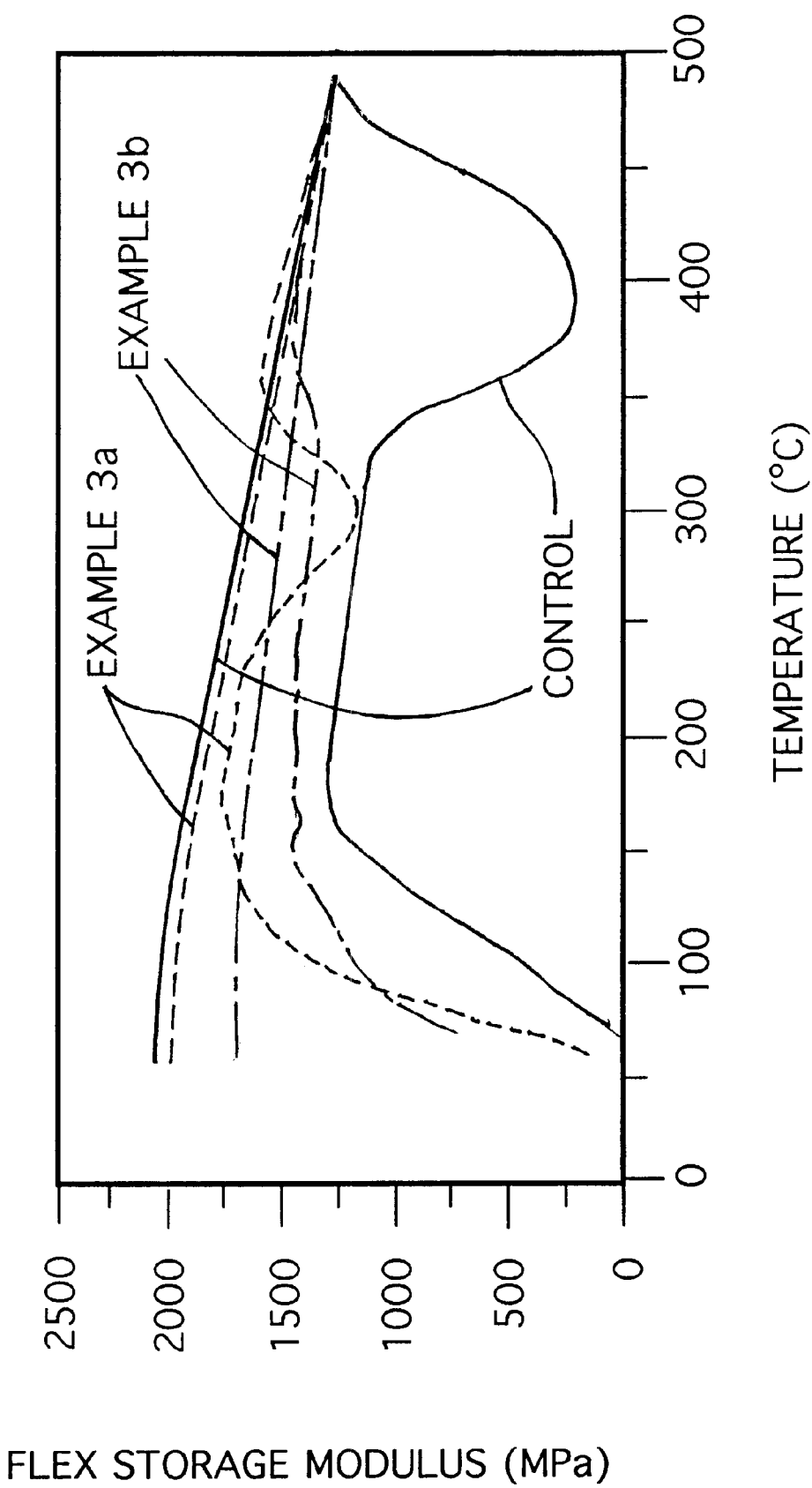

Polyarylene made from a Reaction Mixture with a 1:1 Ratio of Cyclopentadienone to Acetylene To a 100-mL 3-necked round bottom flask fitted with a condenser/nitrogen inlet, a stopper and a thermocouple was added 4,4'-bis(2,4,5-triphenylcyclopentadien-3-one) diphenyl ether (10.00 g,. 1.277E-2 moles), 1,3,5-tris (phenylethynyl)benzene (3.2226 g, 8.515E-3 moles) (mole ratio 3:2), and gamma-butyrolactone (30.85 g). The mixture was stirred and degassed by the application of several vacuum/nitrogen cycles. The mixture was then heated to 200° C. under a nitrogen atmosphere. Samples were withdrawn at 24 hour (Example 3a) and 48 hour (Example 3b) of reaction and diluted to 20 percent solids with cyclohexanone. The solutions were then analyzed by TICA as described above, except for the fact that the thickness of the braid was 0.1 mm. The resultant plots of modulus versus temperature as well as the data from the oligomer solution from 4,4'-bis(2,4,5-triphenylcyclopentadien-3-one)diphenyl ether and 1,3,5-tris(phenylethynyl)benzene mole ratio 1:1 are shown in FIG. 3. The ratio of modulus at the minimum of the curve to the modulus at about 300 to 380° C. after cure for the three samples are 0.65, 0.76, and 0.14 respectively.

EXAMPLE 4

Similar experiments were performed for the formulations listed in Table 1. Data from the TICA analysis is summarized in Table 2.

TABLE 1

| Example Number | Formulation |
|---|---|
| 4 | Control-A[1] + 17 mg of 2,2-Bis(3,4-di(phenylethynyl)phenyl)-1,1,1,3,3,3-hexafluoropropane (BODA) as disclosed in WO97/10193. |
| 5 | Control-A + 17 mg of 1,2-Bis(phenylethynyl)benzene[2] |
| 6a | Control-A + 17 mg of 1,1'[[1,1'-Biphenyl]-4,4'-diylbis(oxy-4,1-phenylene)]bis[3,3-dimethyl-1-triazene][3]. |
| 6b | Control-A + 40 mg of 1,1'[[1,1'-Biphenyl]-4,4'-diylbis(oxy-4,1-phenylene)]bis[3,3-dimethyl-1-triazene][3]. |
| 7 | Control-A + 20 mg of 3,6-Diphenyl-1,2,4,5-tetrazine[2]. |
| 8a | 4,4'-Bis(2,4,5-triphenylcyclopentadien-3-one)diphenyl ether + 2,4,4'-Tris(phenylethynyl)diphenyl ether 23 hours[5]. |
| 8b | 4,4'-bis (2,4,5-triphenylcyclopentadien-3-one)diphenyl ether + 2,4,4'-Tris(phenylethynyl)diphenyl ether 48 hours[5]. |
| 9 | Control-B[4] + 40 mg of 1,2,3,5-Tetrakis(phenylethynyl)benzene[6]. |
| 10 | Control-B + 40 mg of 1,2,4-Tris(phenylethynyl)benzene[7]. |
| 11 | Control-B + 40 mg of 1,2,3,4-Tetrakis(phenylethynyl)benzene[8]. |
| 12 | 4,4'-Bis(2,4,5-triphenylcyclopentadien-3-one)diphenyl ether + 1,2,3,5-Tetrakis(phenylethynyl)benzene B-staged Solution[9]. |
| 13 | Example 12 (1 g) + 25 mg of 1,2,3,5-Tetrakis (phenylethynyl) benzene. |

[1]Control-A is 1 g of the oligomer solution from 4,4'-bis(2,4,5-triphenylcyclopentadien-3-one)diphenyl ether and 1,3,5-tris(phenylethynyl) benzene mole ratio 1:1 (20 percent solids in gamma-butyrolactone/cyclohexanone) ($M_n$ = 8200) as described in WO98/11149.
[2]Available from Aldrich.
[3]Lau. A. N. K., Vo, L. P., Polymer for Microelectronics, ACS Symposium Series 537, 1992, 428.
[4]Control-B is 1 g of the oligomer solution from 4,4'-bis (2,4,5-triphenylcyclopentadien-3-one)diphenyl ether and 1,3,5-tris(phenylethynyl) benzene mole ratio 1:1 (16 percent solids in gamma-butyrolactone/cyclohexanone) ($M_n$ = 8200) as described in WO98/11149.
[5]Synthesis described in Example 14.
[6]Synthesis described in Example 15.
[7]Described in WO98/11149.
[8]Synthesis described in Example 16.
[9]Solution preparation described in Example 17.

EXAMPLE 14

Polyarylene Solution from 4,4'-Bis(2,4,5-triphenylcyclopentadien-3-one)diphenyl Ether and 2,4,4'-Tris(phenylethynyl)diphenyl Ether To a 100-mL three necked round bottom flask fitted with a condenser/nitrogen inlet, a thermocouple, and a stopper were added 4,4'-bis(2,4,5-triphenylcyclopentadien-3-one) diphenyl ether (10.00 g, 1.277E-2 moles), 2,4,4'-tris (phenylethynyl)diphenyl ether (6.01 g, 1.277E-2 moles), and gamma-butyrolactone (37.36 g). The mixture was degassed then heated to 200° C. under a nitrogen atmosphere. After 23 hours of reaction a sample was withdrawn and diluted with cyclohexanone to give a 20 percent solids solution. Sample was analyzed by Size Exclusion Chromatography (SEC) to give a $M_n$ of 5910 and a $M_w$ of 47439 relative to polystyrene standards. After 48 hours of reaction there was a small amount of gel present. The mixture was diluted with cyclohexanone to give 20 percent solids and the soluble portion analyzed by SEC to give a $M_n$ of 6028 and a $M_w$ of 72886 relative to polystyrene standards. Both samples were then analyzed by TICA.

EXAMPLE 15

Synthesis of 1,2,3,5-Tetrakis(phenylethynyl)benzene

In a 250 ml flask was placed 8.8 g (0.020 mole) of 2,4,6-tribromoiodobenzene (Hodgson, H. H., Mahadevan, A. P., *J. Chem. Soc.*, 1947, 173), 18.0 (0.18 mole) of triethylamine, 9.0 g (0.088 mole) of phenylacetylene, and 40 ml of N,N-dimethyl formamide. The reaction mixture was purged with nitrogen for 15 minutes and then 0.63 g (0.0024 mole) of triphenylphosphine and 0.090 g (0.0004 mole) of palladium acetate were added. After heating the reaction mixture at 80° C. under nitrogen atmosphere for 20 hours, the flask was allowed to cool to room temperature, water (100 ml) and toluene (100 ml) were added. The resulting organic layer was washed with 10 percent HCl, water and saturated NaCl and dried with $Na_2SO_4$. The pure product (5.3 g, 55 percent) was obtained upon removal of the solvent and recrystallization from toluene/methanol mixture. $^1$H NMR ($CDCl_3$, 300 MHz) $\delta$7.38 (m, 12H), 7.60 (m, 8H), 7.73 (s, 2H). $^{13}$C NMR ($CDCl_3$, 75 MHz) $\delta$87.3, 87.7, 91.9, 94.2, 99.3, 122.6, 122.9, 123.2, 126.4, 127.4, 128.3, 128.5, 128.6, 131.6, 131.7, 133.9.

EXAMPLE 16

Synthesis of 1,2,3,4-Tetrakis(phenylethynyl)benzene

In a 250 ml flask was placed 11.81 g (0.030 mole) of 1,2,3,4-tetrabromobenzene (Collins, I., Suschitzky, H., *J. Chem. Soc.*, C, 1969, 2337), 27. g (0.267 mole) of triethylamine, 13.6 g (0.132 mole) of phenylacetylene, and 60 ml of N,N-dimethyl formamide. The reaction mixture was purged with nitrogen for 15 minutes and then 0.945 g (0.0036 mole) of triphenylphosphine and 0.135 g (0.0006 mole) of palladium acetate were added. After heating the reaction mixture at 80° C. under nitrogen atmosphere for 20 hours, the flask was allowed to cool to room temperature, water (100 ml) and toluene (100 ml) were added. The resulting organic layer was washed with 10 percent HCl, water and saturated NaCl and dried with $Na_2SO_4$. The pure product (5.4 g, 38 percent) was obtained upon removal of the solvent and recrystallization from hexane/toluene mixture. $^1$H NMR ($CDCl_3$, 300 MHz) $\delta$7.37 (m, 12H), 7.50 (s, 2H), 7.62 (m, 8H). $^{13}$C NMR ($CDCl_3$, 75 MHz) $\delta$87.3, 88.1, 95.5, 98.2, 123.1, 123.4, 125.7, 128.4, 128.5, 128.8, 130.9, 131.8, 131.9.

EXAMPLE 17

Polyarylene Solution from 4,4'-Bis(2,4,5-triphenylcyclopentadien-3-one)diphenyl Ether and 1,2,3,5-Tetrakis(phenylethynyl)benzene To a 50 ml flask was added 4,4'-bis(2,4,5-triphenylcyclopentadien-3-one)diphenyl ether (2.35 g, 0.003 mole), 1,2,3,5-tetrakis(phenylethynyl)benzene (1.44 g, 0.003 mole), and gamma-butyrolactone (8.84 g). The mixture was purged with nitrogen for 15 minutes and then heated to 200° C. for 42 hours under a nitrogen atmosphere. The solution was allowed to cool down to 100° C. and diluted to 20 percent solids with cyclohexanone. $M_w$=18,022 g/mole, polydispersity=3.1.

TABLE 2

| Cross-linker | Minimum Measure Heat-up Modulus/Measure Cured Modulus a the same temperature | Temp. at Minimum | Modulus Ratio Heatup/Cooldown @ 388° C. |
| --- | --- | --- | --- |
| Control | 0.14 | 388° C. | 0.14 |
| Example 1 | 0.58 | 394° C. | 0.59 |
| Example 2a | 0.61 | 405° C. | 0.64 |
| Example 2b | 0.80 | 408° C. | 0.82 |
| Example 3a | 0.65 | 295° C. | 1.0 |
| Example 3b | 0.76 | 313° C. | 0.91 |
| Example 4 | 0.53 | 386° C. | 0.54 |
| Example 5 | 0.17 | 399° C. | 0.19 |
| Example 6a | 0.31 | 396° C. | 0.31 |
| Example 6b | 0.12 | 282° C. | 0.33 |
| Example 7 | 0.22 | 404° C. | 0.25 |
| Example 8a | 0.18 | 355° C. | 0.26 |
| Example 8b | 0.22 | 367° C. | 0.26 |
| Example 9* | — | 281° C.+ | 0.90 |
| Example 10* | — | 275° C.+ | 0.72 |
| Example 11* | — | 271° C.+ | 0.88 |
| Example 12* | 0.54 | 345° C. | 0.74 |
| Example 13* | — | 283° C.+ | 0.94 |

*These formulations were analyzed on a DuFont 982 DMA without a low mass arm accessory and with a glass braid thickness of 0.3 mm. All other samples were run as stated in Example 1.
+extrapolated values

EXAMPLE 18

Anionically polymerized polystyrene (8700 $M_n$), was added, 20 percent by mass relative to solids, to a b-staged solution containing reacted oligomers ($M_n$=5394) from 3 parts 3,3'-(oxydi-4,1-phenylene)bis(2,4,5-triphenyl-2,4-cyclopentadien-1-one) also commonly referred to as 3,3'-(oxydi-1,4-phenylene)bis(2,4,5-triphenylcyclopentadienone), and 2 parts 1,3,5 tris (phenylethynyl)benzene in gamma-butyrolactone and cyclohexanone. The solution was optically transparent with a dark red cast indicating dissolution of the polystyrene into the b-staged resin. The solution was applied to a silicon wafer and cast by spin-coating to form a 3.5 μm thick coating. The film was baked on an MTI hotplate at 320° C. for 2 minutes under nitrogen and then at 400° C. for 10 minutes under nitrogen. The coating on the wafer was further heated at 425° C. under nitrogen for 60 minutes in a Blue M oven. After this latter heating step about 95 percent of the polystyrene was determined by FTIR to have been removed. An estimate of the average pore size based on visual inspection of a TEM view of the film was about 300 nm. The index of refraction of the porous coating was about 1.5; this compares to an index of refraction of 1.63 for the fully dense matrix.

EXAMPLE 19

A solution was prepared as in Example 18. The solution was applied to a silicon wafer and cast by spin-coating to form a 3.3 μm thick coating. The film was baked on a hotplate at 380° C. for 2 minutes under nitrogen and then at 400° C. for 10 minutes under nitrogen. The coating on the wafer was then heated in an oven at 425° C. under nitrogen for 6 minutes. The latter heating step removed about 80 percent of the polystyrene as measured by FTIR. The estimated average pore size was 30 nm. Subsequent heating at 450° C. for 20 minutes removed most of the remaining polystyrene. The pore morphology was essentially unchanged with an average pore size of 30 nm.

What is claimed is:

1. A composition comprising a partially polymerized reaction product of a reaction mixture comprising a compound having two or more cyclopentadienone functional groups and a compound having three or more acetylene functional groups, wherein the composition is further characterized by one or more of the following characteristics (a) the compound having three or more acetylene functional groups is selected from the group consisting of 4',4',4'-tris(phenylethynyl)-1,3,5-triphenylbenzene, and 3',3',3'-tris(phenylethynyl)-1,3,5-triphenylbenzene, (b) the reaction mixture further comprises a compound selected from the group consisting of bis-ortho-diacetylenes, mono-ortho-diacetylenes, bistriazenes, tetrazines, bisazides, and bissulfonylazides, or (c) the composition further comprises a reagent selected from the group consisting of bis-ortho-diacetylenes, mono-ortho-diacetylenes, bistriazenes, tetrazines, bisazides, and bissulfonylazides.

2. The composition of claim 1 which has a modulus profile as measured by torsional impregnated cloth analysis (TICA) characterized by a Minimum Measured Heat-up Modulus at a temperature, Tmin, said Minimum Measured Heat-up Modulus being greater than a value equal to 20 percent of a Measured Cured Modulus at Tmin.

3. The composition of claim 2 wherein the Minimum Measured Heat-up Modulus is greater than a value equal to 50 percent of the Measured Cured Modulus at Tmin.

4. The composition of claim 1 which has a modulus profile as measured by TICA characterized by a ratio of Measured Heat-up Modulus at 388° C. to Measured Cured Modulus at 388° C. greater than 0.2.

5. The composition of claim 4 wherein the ratio is greater than 0.5.

6. The composition of claim 1 further comprising a solvent.

7. An article comprising a substrate and on that substrate a film which comprises the cured reaction product of the composition of claim 1.

* * * * *